United States Patent
Trolle et al.

(10) Patent No.: US 10,359,472 B2
(45) Date of Patent: Jul. 23, 2019

(54) AUTOMATIC IDENTIFICATION OF THE TYPE OF MOTOR

(71) Applicant: DANFOSS POWER ELECTRONICS A/S, Gråsten (DK)

(72) Inventors: Nicolas Trolle, Gråsten (DK); Sanjeet Kumar Dwivedi, Gråsten (DK)

(73) Assignee: Danfoss Power Electronics A/S, Grasten (DK)

( * ) Notice: Subject to any disclaimer, the term of this patent is extended or adjusted under 35 U.S.C. 154(b) by 187 days.

(21) Appl. No.: 15/322,340

(22) PCT Filed: Jul. 8, 2014

(86) PCT No.: PCT/IB2014/062933
§ 371 (c)(1),
(2) Date: Dec. 27, 2016

(87) PCT Pub. No.: WO2016/005790
PCT Pub. Date: Jan. 14, 2016

(65) Prior Publication Data
US 2017/0139011 A1    May 18, 2017

(51) Int. Cl.
G01R 31/34         (2006.01)
H02P 23/14         (2006.01)

(52) U.S. Cl.
CPC ............ *G01R 31/34* (2013.01); *H02P 23/14* (2013.01)

(58) Field of Classification Search
CPC .......................... G01R 31/34; G01R 31/3606; G01R 31/3624; H02P 23/14
See application file for complete search history.

(56) References Cited

U.S. PATENT DOCUMENTS

| 4,670,698 | A  | * | 6/1987  | Fulton     | G01R 31/343 |
|           |    |   |         |            | 318/802     |
| 5,388,052 | A  |   | 2/1995  | Mann       |             |
| 6,570,358 | B2 | * | 5/2003  | Nakatsugawa| H02P 6/16   |
|           |    |   |         |            | 318/490     |
| 7,919,946 | B2 | * | 4/2011  | Ehlich     | G01R 19/2513|
|           |    |   |         |            | 318/34      |
| 8,483,981 | B2 | * | 7/2013  | Heikkila   | H02P 21/16  |
|           |    |   |         |            | 702/117     |
| 8,604,745 | B2 | * | 12/2013 | Villwock   | G01R 31/34  |
|           |    |   |         |            | 318/148     |

(Continued)

FOREIGN PATENT DOCUMENTS

| CN | 1384595 A    | 12/2002 |
| DE | 44 11 149 A1 | 2/1995  |

(Continued)

OTHER PUBLICATIONS

International Search Report for PCT Serial No. PCT/IB2014/062933 dated Mar. 3, 2015.

*Primary Examiner* — Julian D Huffman
*Assistant Examiner* — Michael T Konczal
(74) *Attorney, Agent, or Firm* — McCormick, Paulding & Huber LLP (57) ABSTRACT

An algorithm for identifying a motor type of a multi-phase (typically 3-phase) motor is described. The algorithm applies a series of active voltage vector pulses to the phases of the motor and measures the current rise-time for each applied voltage vector. The motor type is determined on the basis of the measured current rise-times.

13 Claims, 4 Drawing Sheets

(56) References Cited

U.S. PATENT DOCUMENTS

2008/0074070 A1    3/2008  Kumar et al.
2015/0330861 A1*  11/2015  Alsaleem .............. G01M 3/025
                                                    702/183

FOREIGN PATENT DOCUMENTS

| DE | 197 09 596  A1   | 9/1998 |              |
|----|------------------|--------|--------------|
| DE | 19709596    A1 * | 9/1998 | ............. G01R 31/34 |
| EP | 2 270 522   A1   | 1/2011 |              |
| WO | 2005/081005 A1   | 9/2005 |              |

* cited by examiner

Prior Art

AUTOMATIC IDENTIFICATION OF THE TYPE OF MOTOR

CROSS REFERENCE TO RELATED APPLICATION

This application is entitled to the benefit of and incorporates by reference subject matter disclosed in the International Patent Application No. PCT/IB2014/062933 filed on Jul. 8, 2014.

TECHNICAL

The present invention relates to the identification of motor types.

BACKGROUND

Figure 1:
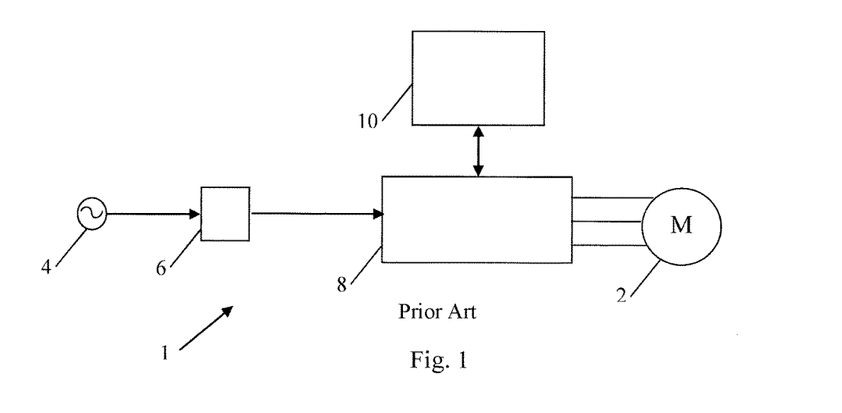
FIG. 1 shows a known inverter drive system.

FIG. 1 shows a simple motor system, indicated generally by the reference numeral 1. The motor system 1 comprises a three-phase motor 2, an AC power source 4, a converter 6, an inverter 8 and a control module 10.

The output of the AC power source 4 is connected to the input of the converter 6. The converter 6 rectifies the AC input from the AC power source 4 (the converter 6 may be a rectifier, although alternatives, such as an active front end, are possible). The rectified output of the converter 6 provides DC power to the inverter 8. In a manner well known in the art, the inverter module includes a switching module, typically comprising insulated gate bipolar transistors (IGBTs) that are driven by gate control signals in order to convert the DC voltage into an AC voltage having a frequency and phase dependent on the gate control signals. The gate control signals are provided by the control module 10. In this way, the frequency, phase and amplitude of each input to the motor 2 can be readily controlled.

The inverter 8 is in two-way communication with the control module 10. The inverter typically monitors currents and voltages in each of the three connections to the motor 2 and provides that current and voltage data to the control module 10 (although the use of both current and voltage sensors is by no means essential). The control module 10 may make use of the current and/or voltage data (where available) when generating the gate control signals required to operate the motor as desired; another arrangement is to estimate the currents from the drawn voltages and the switching pattern—other control arrangements also exist.

The motor 2 may take many different forms. Exemplary motor types include induction motors, synchronous reluctance motors and various forms of permanent magnet motors. Different motor types typically require different control algorithms. In the event that the system 1 allows the type of the motor 2 to be changed, then in order for the system 1 to control the motor 2, it is necessary to identify the motor type.

It is known for a motor commissioning algorithm to require a technician to manually input the motor type being used. It is possible for the technician to input the wrong type of motor, with the result that the motor is not correctly controlled. In some circumstances, this could result in the motor operating inefficiently. In other circumstances, this could result in the motor failing to operate at all.

There remains a need for providing improved or alternative approaches for the identification of motor types.

The present invention seeks to address at least some of the problems outlined above.

SUMMARY

The present invention provides a method for identifying a motor type of a multi-phase (typically 3-phase) motor, the method comprising: applying a voltage pulse (an "active" voltage vector pulse) to each phase of the motor in turn, the voltage pulses including a positive voltage pulse and a negative voltage pulse for each phase of the motor; measuring a current rise-time for each applied voltage pulse; and determining the motor type depending on the measured current rise-times. The current rise-time may be defined as the time taken for the current to rise to a predefined level in response to the application of a voltage pulse; however, alternative definitions are possible, such as a definition related to the ratio between resulting current and on time of active voltage vector.

The invention may further comprise determining whether the current rise-time for each applied voltage pulse is the same and, if so, identifying that the motor type is an asynchronous motor. Two rise times might be determined to be the same if they the same to within a margin of error. By way of example, a suitable margin of error might be ±10 microseconds, but different margins of error (including margins expressed as a percentage, such as ±5%) could be used.

The invention may further comprise determining whether the current rise-time for each phase of the motor is equal for the positive applied voltage pulse and the negative applied voltage pulse for that phase (but the rise times for all phases are not equal) and, if so, identifying that the motor type is a synchronous reluctance motor. The rise times for positive and negative applied voltage pulses might be deemed to be equal if they are the same to within a margin of error. By way of example, a suitable margin of error might be ±10 microseconds, but different margins of error (including margins expressed as a percentage, such as ±5%) could be used. This step may be applied after it has been determined that the current rise times in response to the applied pulses are not all the same.

The invention may further comprise determining the average of the rise times for the positive and negative applied voltage pulses for each phase of the motor. This step may be applied after it has been determined that at least one phase of the motor has current rise times in response to positive and negative applied voltage pulses that are different.

The invention may further comprise determining whether the average rise times for each phase (i.e. both positive and negative pulses) are equal (but not all rise times for all phases are equal) and, if so, identifying the motor type as a surface mount permanent magnet motor. The average rise times for each phase might be deemed to be equal if they are the same to within a margin of error. In this case, it may be more difficult to predict a suitable margin of error, because this rise time will be different with different type of rotor magnet, different saturation characteristics of stator iron core and different current rating of permanent magnet motors. However this discrimination in rise time will often be more than level set for asynchronous motors, as described above.

The invention may further comprise determining whether the average rise times for each phase are equal and, if not, identifying a mid-phase of the motor that does not have either the highest or the lowest average rise time. The average rise times for each phase might be deemed to be equal if they are the same to within a margin of error. By way of example, a suitable margin of error might be ±10 microseconds, but different margins of error (including margins expressed as a percentage, such as ±5%) could be used.

The invention may further comprise determining whether the current rise-time for the identified mid-phase of the motor is equal for the positive applied voltage pulse and the negative applied voltage pulse for that phase and, if so, identifying the motor type as an interior permanent magnet motor. The average rise times for the positive and negative applied voltage pulse for a particular phase might be deemed to be equal if they are the same to within a margin of error. By way of example, a suitable margin of error might be ±10 microseconds, but different margins of error (including margins expressed as a percentage, such as ±5%) could be used. The identification of the motor as an interior permanent magnet motor may additionally require that the average rise times for each phase are not equal.

The invention may further comprise determining whether the current rise-time for the identified mid-phase of the motor is equal for the positive applied voltage pulse and the negative applied voltage pulse for that phase and, if not, identifying the motor type as an inverse interior permanent magnet motor. The average rise times for each phase might be deemed to be equal if they are the same to within a margin of error. By way of example, a suitable margin of error might be value±10 microseconds, but different margins of error (including margins expressed as a percentage, such as ±5%) could be used. The identification of the motor as an inverse interior permanent magnet motor may additionally require that the average rise times for each phase are not equal.

The present invention also provides an apparatus comprising: an output configured to apply a voltage pulse to each phase of the motor in turn, the voltage pulses including a positive voltage pulse and a negative voltage pulse for each phase of the motor; means for determining a current rise-time for each applied voltage pulse; and means for determining the motor type depending on the measured current rise-times. Clearly, any of the features of the invention as described above (either alone or in combination) could form part of some embodiments of the apparatus of the invention.

BRIEF DESCRIPTION OF THE DRAWINGS

The invention will now be described in further detail with reference to the following schematic drawings, in which.

DETAILED DESCRIPTION

Figure 2:
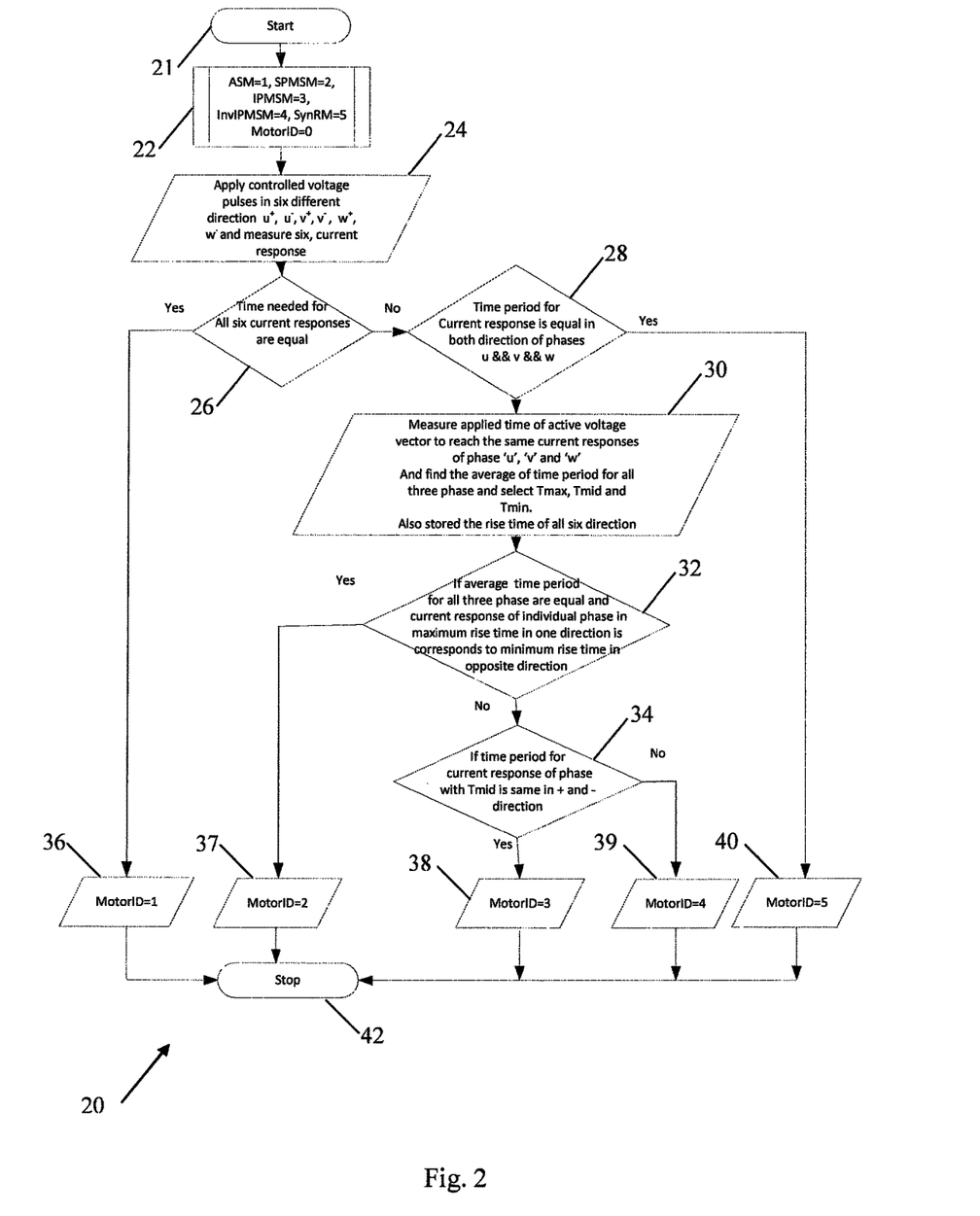
FIG. 2 is a flow chart showing an algorithm in accordance with an aspect of the present invention.

FIG. 2 is a flow chart showing an algorithm, indicated generally by the reference numeral 20, in accordance with an aspect of the present invention.

The algorithm 20 starts at step 21, and then moves to step 22. At step 22, the motor types that the algorithm can identify are indicated. As shown in FIG. 2, MotorID=1 indicates that the motor is an asynchronous motor (ASM), MotorID=2 indicates that the motor is a surface mount permanent magnet motor (SMPSM), MotorID=3 indicates that the motor is an interior permanent magnet synchronous motor (IPMSM), MotorID=4 indicates that the motor is an inverse interior permanent magnet synchronous motor (In-vIPMSM) and MotorID=5 indicates that the motor is a synchronous reluctance motor (SynRM). Since the motor type is at this stage unknown, the variable MotorID is set to 0 in step 22. The motor types shown in FIG. 2 are provided by way of example only. The principles of the present invention could be used to identify a sub-set of those motor types and could be extended to identify other motor types.

Next, at step 24 of the algorithm 20, six different active voltage vector pulses are applied to the motor.

Figure 3:
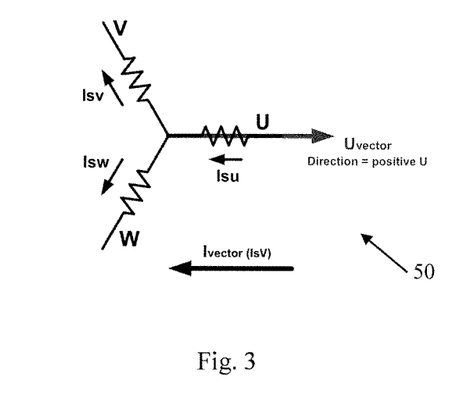
FIG. 3 is a vector diagram of a three-phase motor showing a representation of a voltage pulse applied in accordance with an aspect of the present invention.

FIG. 3 is a vector diagram of a three-phase motor showing a representation of a voltage vector pulse applied in accordance with an aspect of the present invention. In the example of FIG. 3, a positive U voltage vector is applied. As shown in FIG. 3, in response to the application of a positive U voltage (so that no positive voltage is applied to either to v-phase of the w-phase of the motor), a positive u-phase current vector (6) is induced (so that a current flows into the motor through the u-phase connection). As shown in FIG. 3, if a current flows into the motor through the u-phase connection, then currents must flow out of the motor through the v- and w-phases of the motor (such that negative current vectors $I_{sv}$ and $I_{sw}$ are provided).

Figure 4:
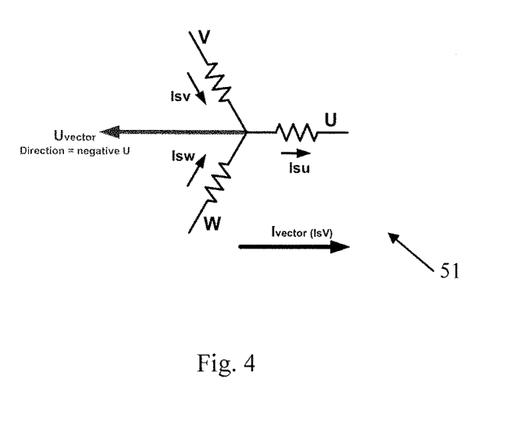
FIG. 4 is a vector diagram of a three-phase motor showing a representation of a voltage pulse applied in accordance with an aspect of the present invention.

In the step 24 of the algorithm 20, six active voltage vector pulses are applied to the motor 10 in turn. The positive U vector shown in FIG. 3 is one of those six voltage pulses. A second voltage pulse is a negative U vector as shown in FIG. 4. As shown in FIG. 4, a negative U vector causes current to flow into the motor 10 through the v- and w-phase connections (positive $I_{sv}$ and $I_{sw}$) and causes a current to flow out of the u-phase connection (negative $I_{su}$).

In addition to positive and negative U vectors, the step 24 applies positive V voltage pulse, a negative V voltage pulse, a positive W voltage pulse and a negative W voltage pulse. The six active voltage vectors are often referred to using a (u,v,w) co-ordinate system, as follows:

(1,0,0)=positive U voltage vector
(0,1,1)=negative U voltage vector;
(0,1,0)=positive V voltage vector;
(1,0,1)=negative V voltage vector;
(0,0,1)=positive W voltage vector; and
(1,1,0)=negative W voltage vector.

At step 24, when each active voltage vector pulse is applied to the motor, the time taken for the current response to rise to a defined level as a result of that voltage pulse is recorded (referred to below as current rise times). It should be noted that alternative definitions of current rise times are possible and such alternatives are within the scope of the present invention.

Thus, with step 24 completed, six different current rise times are recorded, namely current rise times in response to the following voltage pulses: positive u-pulse, negative u-pulse, positive v-pulse, negative v-pulse, positive w-pulse, negative w-pulse. These rise times are referred to as $u^+$, $u^-$, $v^+$, $v^-$, $w^+$ and $w^-$ rise times respectively. These data are used to determine the motor type, as described further below.

From step 24, the algorithm 20 moves to step 26, where it is determined whether all six rise times are equal, i.e. it is determined whether:

$u^+ = u^- = v^+ = v^- = w^+ = w^-$

The rise times are deemed to be equal if they are the same to within a margin of error. For example, all six rise times may be deemed to be equal if they are all within 10 microseconds of the average rise time or to within 5% of the average rise time. Of course, alternative margins of error are possible. The margin of error may, for example, depend on the type or size of motor in question.

If all of the rise times are equal, MotorID is set to 1 at step 36 of the algorithm 20 (indicating that an asynchronous motor (ASM) has been identified) and the algorithm then terminates at step 42. If not, the algorithm moves to step 28.

At step 28, it is determined whether the rise time for the two directions of a particular phase vector are the same. Thus it is determined whether (within a margin of error):

$u^+ = u^-$; and
$v^+ = v^-$; and
$w^+ = w^-$

For example, $w^+$ may be considered to be the same as $w^-$ if the measured rise times are within a given margin of error (e.g. 10 microseconds or 5% of one another).

If so, the algorithm moves to step 40, where MotorID is set to 5 (indicating that the motor has been identified as a synchronous reluctance motor) and the algorithm then terminates at step 42. If not, the algorithm moves to step 30.

At step 30, the average phase u rise time is determined by taking the average of the positive u and negative u rise times. Similarly, the average phase-v and phase-w rise times are determined. Thus, the following are calculated:

$u_{average} = (u^- + u^+)/2$;
$v_{average} = (v^- + v^+)/2$; and
$w_{average} = (w^- + w^+)/2$.

From the three average times, the phase with the maximum average rise time (denoted $T_{max}$), the phase with the middle average rise time (denoted $T_{mid}$) and the phase with the minimum rise time (denoted $T_{min}$) are determined. In addition to the average time for each phase, the individual times for $u^+$, $u^-$, $v^+$, $v^-$, $w^+$ and $w^-$ are also recorded. The algorithm then moves to step 32.

At step 32, it is determined if all three average time $u_{average}$, $V_{average}$, $W_{average}$ are equal and the maximum individual rise time corresponds to same phase with minimum rise time in opposite direction. If so, MotorID is set to 2 at step 37 of the algorithm 20 (indicating that a surface mount permanent magnet motor (SMPSM) has been identified) and the algorithm then terminates at step 42. If not, the algorithm moves to step 34. It should be noted that, generally, if the average rise times are equal, but not all rise times are equal, then the phase with the maximum individual rise time will also be the phase having the minimum rise time in the opposite direction, accordingly, this second part of the test could be omitted. Nevertheless, it could be useful in some circumstances, not least to provide an additional check that this test has been met.

At step 34, it is determined if all three average time $u_{average}$, $V_{average}$, $W_{average}$ are different and the phase with middle rise time ($T_{mid}$) is considered. It is determined whether, for that phase, the positive rise time is equal to the negative rise time (possibly within a margin of error). If so, MotorID is set to 3 at step 38 of the algorithm 20 (indicating that an interior permanent magnet synchronous motor (IP-MSM) has been identified) and the algorithm then terminates at step 42. If not, MotorID is set to 4 (indicating that an inverse interior permanent magnet synchronous motor (InvIPMSM) has been identified) and the algorithm terminates at step 42.

The algorithm 20 described above provides some exemplary methods for identifying motor types. FIGS. 5 to 8 show example methods of identifying particular motor types.

Figure 5:
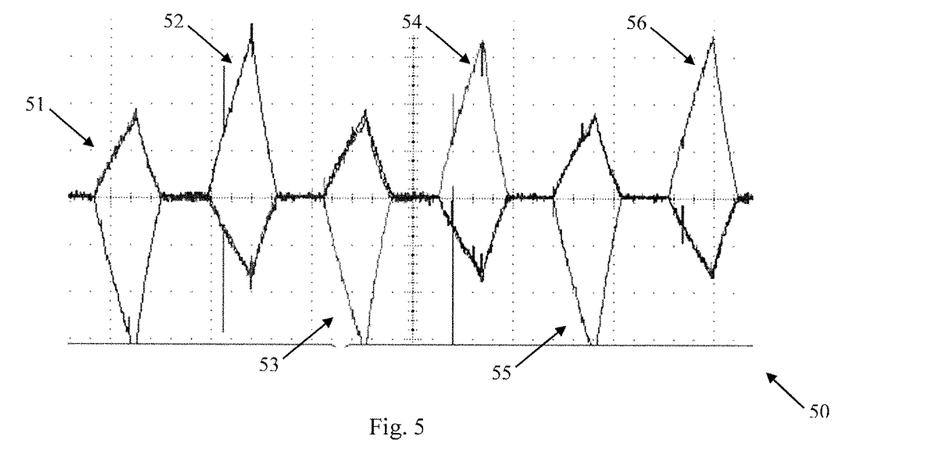
FIG. 5 is a plot showing motor currents generated in response to the application of voltage pulses to an exemplary asynchronous motor.

FIG. 5 is a plot, indicated generally by the reference numeral 50, motor currents generated in response to the application of voltage pulses to an exemplary asynchronous motor.

The plot 50 shows motor u-phase, v-phase and w-phase currents in the exemplary motor. The currents in response to six active voltage vector pulses are shown. The first current pulses 51 are in response to a positive u-phase voltage pulse, the second current pulses 52 are in response to a negative u-phase voltage pulse, the third current pulses 53 are in response to a positive v-phase voltage pulse, the fourth current pulses 54 are in response to negative v-phase voltage pulse, the fifth current pulses 55 are in response to a positive w-phase voltage pulse and the sixth current pulses 56 are in response to a negative w-phase voltage pulse.

The first and second currents pulses 51 and 52 are in response to a u-phase voltage pulses. For the reasons explained above with reference to FIGS. 3 and 4, the u-phase voltage pulses result in large u-phase currents and smaller v-phase and w-phase currents. Similarly, the third and fourth current pulses 53 and 54 include large v-phase currents and smaller u-phase and w-phase currents in response to a v-phase voltage pulses. Finally, the fifth and sixth currents pulses 55 and 56 include large w-phase currents and smaller u-phase and v-phase currents in response to a w-phase voltage pulse.

The rise time of all of the current pulses 51 to 56 is measured at about 800 µs. Thus, the rise time of all of the current pulses is the same. In other words:

$u^+ = u^- = v^+ = v^- = w^+ = w^- = 800$ µs

Following the algorithm 20, the step 26 is answered in the positive. Accordingly, the motor under test in FIG. 5 is correctly identified as an asynchronous motor.

Figure 6:
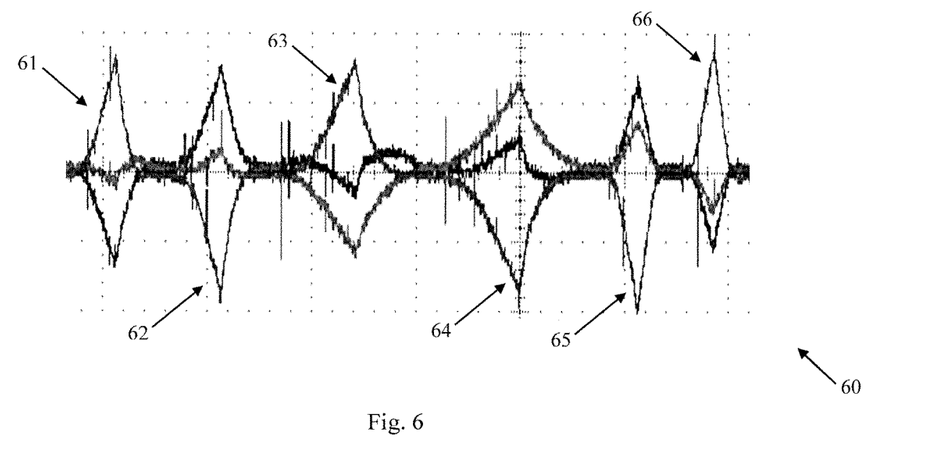
FIG. 6 is a plot showing motor currents generated in response to the application of voltage pulses to an exemplary synchronous reluctance motor.

FIG. 6 is a plot, indicated generally by the reference numeral 60, showing motor currents generated in response to the application of voltage pulses to an exemplary synchronous reluctance motor.

The plot 60 shows motor u-phase, v-phase and w-phase currents in the exemplary motor. As with the plot 50 described above, the currents in response to six active voltage vector pulses are shown. The first current pulses 61 are in response to a positive u-phase voltage pulse, the second current pulses 62 are in response to a negative u-phase voltage pulse, the third current pulses 63 are in response to a positive v-phase voltage pulse, the fourth current pulses 64 are in response to negative v-phase voltage pulse, the fifth current pulses 65 are in response to a positive w-phase voltage pulse and the sixth current pulses 66 are in response to a negative w-phase voltage pulse.

It is clear that the pulses in the plot 60 do not all have the same rise times. Accordingly, the step 26 of the algorithm 20 is answered in the negative, so that the algorithm 20 moves to step 28.

The rise times for the various pulses in the plot 60 are as follows:

$u^+ = u^- = 600$ µs; and
$v^+ = v^- = 1200$ µs; and
$w^+ = w^- = 400$ µs

Thus, the rise times for each phase (positive and negative) are the same so that the step 28 of the algorithm 20 is answered in the positive. Accordingly, the motor under test in FIG. 6 is correctly identified as a synchronous reluctance motor.

Figure 7:
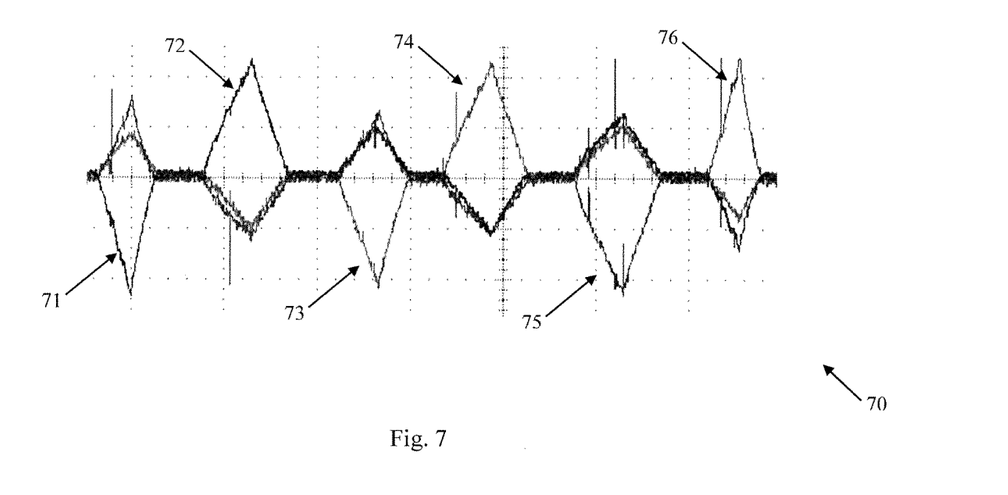
FIG. 7 is a plot showing motor currents generated in response to the application of voltage pulses to an exemplary surface permanent magnet synchronous motor.

FIG. 7 is a plot, indicated generally by the reference numeral 70, showing motor currents generated in response to the application of voltage pulses to an exemplary surface permanent magnet synchronous motor.

The plot 70 shows motor u-phase, v-phase and w-phase currents in the exemplary motor. As with the plots 50 and 60 described above, the currents in response to six active voltage vector pulses are shown. The first current pulses 71 are in response to a positive u-phase voltage pulse, the second current pulses 72 are in response to a negative u-phase voltage pulse, the third current pulses 73 are in response to a positive v-phase voltage pulse, the fourth current pulses 74 are in response to negative v-phase voltage pulse, the fifth current pulses 75 are in response to a positive w-phase voltage pulse and the sixth current pulses 76 are in response to a negative w-phase voltage pulse.

The rise times for the various pulses in the plot 70 are as follows:

$u^+$=400 μs;
$u^-$=500 μs;
$v^+$=400 μs;
$v^-$=500 μs;
$w^+$=700 μs; and
$w^-$=200 μs It is clear that the pulses in the plot 70 do not all have the same rise times. It is also clear that the positive and negative pulses for the same phase in the plot 70 do not have the same rise time. Accordingly, the steps 26 and 28 of the algorithm 20 are both answered in the negative, so that the algorithm 20 moves to step 30.

At step 30, the average rise time for each phase (both positive and negative) is determined. In this case, all phases have an average rise time of 450 μs). Accordingly, the motor under test in FIG. 7 is correctly identified as a surface permanent magnet synchronous motor (SPMSM).

Figure 8:
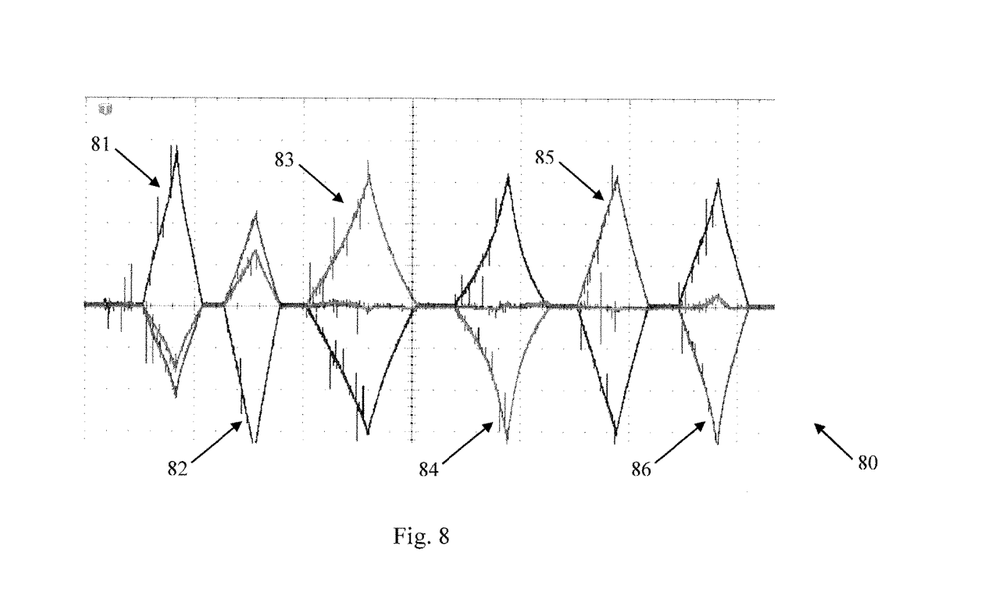
FIG. 8 is a plot showing motor currents generated in response to the application of voltage pulses to an exemplary interior permanent magnet synchronous motor.

FIG. 8 is a plot, indicated generally by the reference numeral 80, showing motor currents generated in response to the application of voltage pulses to an exemplary interior permanent magnet synchronous motor.

The plot 80 shows motor u-phase, v-phase and w-phase currents in the exemplary motor. As with the plots 50, 60 and 70 described above, the currents in response to six active voltage vector pulses are shown. The first current pulses 81 are in response to a positive u-phase voltage pulse, the second current pulses 82 are in response to a negative u-phase voltage pulse, the third current pulses 83 are in response to a positive v-phase voltage pulse, the fourth current pulses 84 are in response to negative v-phase voltage pulse, the fifth current pulses 85 are in response to a positive w-phase voltage pulse and the sixth current pulses 86 are in response to a negative w-phase voltage pulse.

The rise times for the various pulses in the plot 80 are as follows:

$u^+$=1000 μs;
$u^-$=800 μs;
$v^+$=2400 μs;
$v^-$=1600 μs;
$w^+$=1400 μs; and
$w^-$=1400 μs It is clear that the pulses in the plot 80 do not all have the same rise times and that the positive and negative pulses for the same phase in the plot 80 do not have the same rise time.

Accordingly, the steps 26 and 28 of the algorithm 20 are both answered in the negative. It is also clear that the average rise times for the three phases of the motor are different, so that the step 32 is also answered in the negative. The algorithm 20 therefore moves to step 34.

In step 34, it is determined that all three average rise times $u_{average}$, $V_{average}$, $W_{average}$ are different and the phase with middle rise time ($T_{mid}$) (the w phase) has the same rise time in both directions. Accordingly, the motor is correctly identified as an interior permanent magnet synchronous Motor (IPMSM).

The various methods for identifying motor types as described above with reference to FIG. 2 are provided by way of example; alternatives exist. For example, the different motor types can be identified by considering difference of rise time in positive and negative direction and whole logic is based on this delta time as well as the identifying process corresponds to first determine the position of magnetic axis by voltage pulses in six different direction and then applying additional test pulses. Further, there may exist further variants where the physical parameters of the motor itself are considered.

The embodiments of the invention described above are provided by way of example only. The skilled person will be aware of many modifications, changes and substitutions that could be made without departing from the scope of the present invention. For example, although the invention has generally been described with reference to three-phase motors, the principles of the invention are application to other multi-phase motors. The claims of the present invention are intended to cover all such modifications, changes and substitutions as fall within the spirit and scope of the invention.

What is claimed is:

1. A method for identifying a motor type of a multi-phase motor, the method comprising:
    applying a voltage pulse to each phase of the motor in turn, the voltage pulses including a positive voltage pulse and a negative voltage pulse for each phase of the motor;
    determining a current rise-time for each applied voltage pulse by measuring a time taken for the current to rise to a predetermined level in response to the application of the respective voltage pulse;
    determining the motor type depending on the measured current rise-times; and
    determining the average of the rise times for the positive and negative applied voltage pulses for each phase of the motor.

2. The method as claimed in claim 1, the method further comprising:
    determining whether the current rise-time for each applied voltage pulse is the same and, if so, identifying that the motor type is an asynchronous motor.

3. The method as claimed in claim 2, the method further comprising determining the average of the rise times for the positive and negative applied voltage pulses for each phase of the motor.

4. The method as claimed in claim 1, the method further comprising:
    determining whether the current rise-time for each phase of the motor is equal for the positive applied voltage pulse and the negative applied voltage pulse for that phase and, if so, identifying that the motor type is a synchronous reluctance motor.

5. The method as claimed in claim 4, the method further comprising determining the average of the rise times for the positive and negative applied voltage pulses for each phase of the motor.

6. The method as claimed in claim 1, the method further comprising determining whether the average rise times for each phase are equal and, if so, identifying the motor type as a surface mount permanent magnet motor.

7. The method as claimed in claim 5, the method further comprising determining whether the average rise times for each phase are equal and, if not, identifying a mid-phase of the motor that does not have either the highest or the lowest average rise time.

8. The method as claimed in claim 1, the method further comprising determining whether the average rise times for each phase are equal and, if not, identifying a mid-phase of the motor that does not have either the highest or the lowest average rise time.

9. The method as claimed in claim 8, the method further comprising determining whether the current rise-time for the identified mid-phase of the motor is equal for the positive applied voltage pulse and the negative applied voltage pulse for that phase and, if so, identifying the motor type as an interior permanent magnet motor.

10. The method as claimed claim 9, the method further comprising determining whether the current rise-time for the identified mid-phase of the motor is equal for the positive applied voltage pulse and the negative applied voltage pulse for that phase and, if not, identifying the motor type as an inverse interior permanent magnet motor.

11. The method as claimed in claim 8, the method further comprising determining whether the current rise-time for the identified mid-phase of the motor is equal for the positive applied voltage pulse and the negative applied voltage pulse for that phase and, if not, identifying the motor type as an inverse interior permanent magnet motor.

12. The method as claimed in claim 2, the method further comprising:
   determining whether the current rise-time for each phase of the motor is equal for the positive applied voltage pulse and the negative applied voltage pulse for that phase and, if so, identifying that the motor type is a synchronous reluctance motor.

13. An apparatus comprising:
   an output configured to apply a voltage pulse to each phase of the motor in turn, the voltage pulses including a positive voltage pulse and a negative voltage pulse for each phase of the motor;
   means for determining a current rise-time for each applied voltage pulse by measuring a time taken for the current to rise to a predetermined level in response to the application of the respective voltage pulse; and
   means for determining the motor type depending on the measured current rise-times, wherein the means for determining the motor type determines the average of the rise times for the positive and negative applied voltage pulses for each phase of the motor.

* * * * *

UNITED STATES PATENT AND TRADEMARK OFFICE
CERTIFICATE OF CORRECTION

PATENT NO.       : 10,359,472 B2
APPLICATION NO.  : 15/322340
DATED            : July 23, 2019
INVENTOR(S)      : Nicolas Trolle et al.

Page 1 of 1

It is certified that error appears in the above-identified patent and that said Letters Patent is hereby corrected as shown below:

In the Claims

Column 9, Claim 7, Line 9, delete "5" and insert --6--.

Signed and Sealed this
Nineteenth Day of November, 2019

Andrei Iancu
*Director of the United States Patent and Trademark Office*